United States Patent
Krein (10) Patent No.: US 6,700,803 B2
(45) Date of Patent: Mar. 2, 2004

(54) SYSTEMS AND METHODS FOR PULSE WIDTH MODULATION

(75) Inventor: Philip T. Krein, Champaign, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 0 days.

(21) Appl. No.: 10/222,251

(22) Filed: Aug. 14, 2002

(65) Prior Publication Data

US 2003/0103361 A1 Jun. 5, 2003

Related U.S. Application Data

(60) Provisional application No. 60/312,163, filed on Aug. 14, 2001.

(51) Int. Cl.[7] .............................................. H02M 1/12
(52) U.S. Cl. ....................................................... 363/41
(58) Field of Search .............................. 363/40, 41, 21.1, 363/21.18, 26; 318/811; 376/238; 332/109

(56) References Cited

U.S. PATENT DOCUMENTS

| | | | | |
|---|---|---|---|---|
| 5,418,932 A | * | 5/1995 | Watabe et al. ............... 713/500 |
| 5,742,151 A | * | 4/1998 | Hwang ........................ 323/222 |
| 5,886,586 A | * | 3/1999 | Lai et al. ..................... 332/109 |
| 6,259,611 B1 | * | 7/2001 | Ito et al. ....................... 363/41 |
| 6,469,916 B1 | * | 10/2002 | Kerkman et al. ............. 363/41 |

OTHER PUBLICATIONS

"Study on d–q Equivalent Circuit Topologies of HF Base Converters with Circulating Current," Matsui et al., IEE/Japan International Power Electronics Conference, vol. 1, Apr. 1990, pp. 212–219.

* cited by examiner

Primary Examiner—Adolf D. Berhane
(74) Attorney, Agent, or Firm—Greer, Burns & Crain, Ltd.

(57) ABSTRACT

A method for generating pulse width modulated control signal has the steps of providing a base carrier waveform, segmenting the base carrier waveform into a plurality of carrier waveforms, and providing at least one modulating signal. The first and second waveforms are compared to the at least one modulating signal to produce first and second comparator outputs, which are then mathematically combined to produce a pulse width modulated control signal.

28 Claims, 9 Drawing Sheets

SYSTEMS AND METHODS FOR PULSE WIDTH MODULATION

CROSS REFERENCE

The present application claims priority under 35 U.S.C. §119 of U.S. Provisional Patent Application No. 60/312,163 filed on Aug. 14, 2001.

FIELD OF THE INVENTION

The present invention relates, in general, to pulse width modulation ("PWM") methods and systems.

BACKGROUND OF THE INVENTION

By way of definition and background, a PWM (pulse width modulated) signal is one in which the information is contained in the width of each pulse, typically of a repeating string of pulses. It may be considered a form of analog signal in that the information is contained in the time duration of a pulse, which is varied continuously, or in such small steps as to be effectively continuous. That is to be contrasted with a digital signal in which information is contained in discrete steps (such as two steps for binary) and in which values are assigned to the various discrete combinational possibilities.

Many circuits use PWM techniques for a variety of purposes. In one example, PWM is used to control most types of DC to AC converters, called inverters. PWM control may be used to control inverters in any of a variety of inverter applications, with examples including power supply applications such as uninterruptible powers supplies and the like, alternative energy applications such as fuel cells, motor drives, audio amplifiers, and the like.

There are many known methods for creating PWM signals. Conventional PWM sequences, for instance, may be generated by comparing a triangle or ramp carrier with a modulating function. Typically, signals are created that contain both high-frequency switching energy and low frequency waveform energy. Generally, the low frequency content limits the overall PWM applications. Inverters for motor drives, for example, can be complicated systems that must reconstruct gate drive waveforms and deliver power without transformer coupling. The desire to avoid transformers has hampered development of a "general purpose inverter."

A high frequency AC link inverter, in which a high-frequency transformer is inserted for power delivery, was proposed in "High-frequency link power conversion", Espelage et al., IEEE Trans. Industry Applications, Vol. IA-13, pp. 387–394 (1977), herein incorporated by reference. Although this technology allows for power to be converted through a transformer, it has not been widely implemented due to its complexity. Indeed, most known high frequency link implementations require a generally complex, multi-stage power conversion design: an initial open loop inverter, the transformer, a rectifier, and then a final PWM inverter stage.

There are also multi-level inverters, which use several different dc input voltages to produce a waveform that tracks a modulating signal more closely than conventional two-level and three-level inverters. They are common in high-voltage applications, since the switches in them act in series. It is generally known that the control signals for multi-level inverters can be generated through a multiple-carrier PWM process. In such systems, the triangle carrier is shifted up or down to form a set of carriers corresponding to each output level. This approach, however, does not support high-frequency links or provide a way to simplify the inverter system itself. It intended solely to facilitate the use of many switches in a series configuration. Further descriptions of such systems may be found, by way of example, in, "A new multilevel PWM method: a theoretical analysis," Carrara et al., IEEE Trans. Power Electronics, vol. 7, pp. 497–505 (1992).

Another method has been proposed to eliminate some of the multiple stages. "High-frequency link DC/AC converter with suppressed voltage clamp circuits—naturally commutated phase angle control with self turn-off devices," by Matsui et al., IEEE Trans. Ind. Applications, vol. 32, pp. 293–300, March/April (1996), herein incorporated by reference, discloses a naturally commutated cycloconverter-based inverter. No output or internal PWM signal is disclosed, however. Further, the disclosed method does not extend well to typical PWM applications that require precise PWM waveform and control.

Unresolved needs in the art therefore exist.

SUMMARY OF THE INVENTION

Generally, the present invention is directed to PWM systems and methods. A method of the invention has the steps of segmenting a base carrier waveform into a plurality of carrier waveforms, and providing at least one modulating signal. The plurality of carrier waveforms are compared to the at least one modulating signal to produce a plurality of comparator outputs, which are then mathematically combined to produce a pulse width modulated control signal. In a preferred embodiment of the invention, this pulse width modulated control signal is then convolved with a clock signal to produce a final pulse width modulated output.

An exemplary system of the invention for generating a gate drive sequence includes a segmenter operative to segment a base carrier waveform into a plurality of carrier waveforms, and a plurality of comparators linked to the segmenter and also linked to at least one modulating signal. The plurality of comparators are operative to compare the plurality of carrier waveforms to the at least one modulating signal. A mathematical operator is further provided that is linked to each of the comparators and operative to output the gate drive sequence defined through mathematical combination of the plurality of comparator outputs. In a preferred system for providing pulse width modulated output, a switching circuit is additionally provided. The gate control sequence and a square wave Signal are input to the switching circuit which uses the signals to produce a pulse width modulated output.

Methods and systems of the invention solve many otherwise unresolved problems of the prior art and provide valuable advantages. For example, through practice of multiple-carrier PWM methods and systems of the invention, relatively low cost and low complexity inverter designs can be achieved that support transformer isolation and offer other advantages. It is also possible to combine more than one modulating signal into a single output that entails independent PWM of each modulating signal. These and other advantages of the invention will be better appreciated through consideration of the invention embodiments described in detail below.

DETAILED DESCRIPTION

Figure 1:
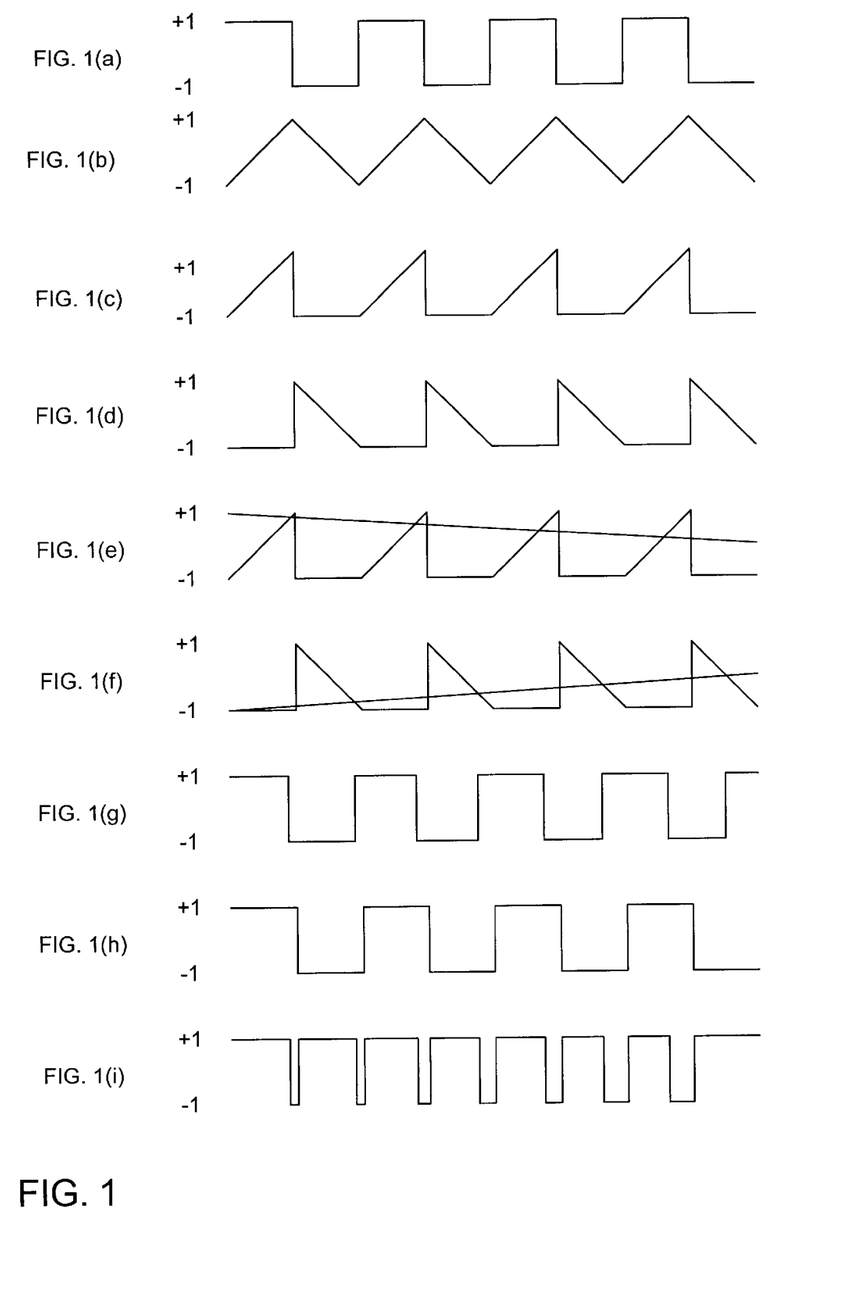
FIG. 1(a–c) includes graphical illustrations of waveforms useful for illustrating steps of an exemplary method of the invention.

Turning now to the drawings, FIG. 1 is useful in illustrating an exemplary method of the invention for generating a PWM output. FIG. 1(*a*) illustrates a square wave clock signal, while FIG. 1(*b*) illustrates a base carrier waveform in the general form of a triangle carrier. A method of the invention segments the triangle shaped base carrier waveform on a time basis into a rising portion carrier waveform, shown in FIG. 1(*c*), and into a falling portion carrier waveform shown in FIG. 1(*d*). The result of performing a step of comparing the rising portion waveform of FIG. 1(*c*) to a modulating function in a comparator is graphically shown in FIG. 1(*e*), and the result of a step of comparing the falling portion waveform of FIG. 1(*d*) to the negative or 180° phase shifted modulating function is shown in FIG. 1(*f*). The outputs of these comparisons are consistent with traditional PWM signals. In a method of the present invention, however, additional steps of combining these two signals to produce a single PWM control signal occur.

FIG. 1(*g*) shows the result of adding the outputs of the comparisons graphically represented in FIG. 1(*e*) and 1(*f*). The resultant waveform of FIG. 1(*g*) preserves the information originally present in the carrier waveform of FIG. 1(*b*). This PWM signal may be used to control any of a variety of controls, and accordingly may be referred to as a "gate control sequence." When it is used as the input to a square-wave inverter switching at the same original clock frequency shown again for convenience in FIG. 1(*h*), the inverter output graphically shown in FIG. 1(*i*) is a conventional PWM signal. Advantageously, each switching device used in processing the various waveforms is controlled with a square wave of duty ratio approximately 50%, while the relative timing of the two square waves yields the final PWM output.

Methods of the invention may be practiced using other forms of base carriers, with an example including, but not limited to, sawtooth waveforms that are always rising. Also, those knowledgeable in the art will appreciate that other steps of segmenting the base carrier waveform other than based on time may be practiced. For example, segmenting may be practiced based on high and low voltage levels, phase shifting, and the like. A triangle base carrier waveform, for instance, may be of sawtooth form that is then segmented into a high portion and a low portion based on voltage level. It will be appreciated that use of these carrier waveforms in practice of the invention will yield similar PWM outputs, but with distinct timing properties that can be exploited in useful ways. The square waveform PWM output of FIG. 1(*i*), for instance, always displays phase-leading behavior relative to the original square wave clock.

Figure 2:
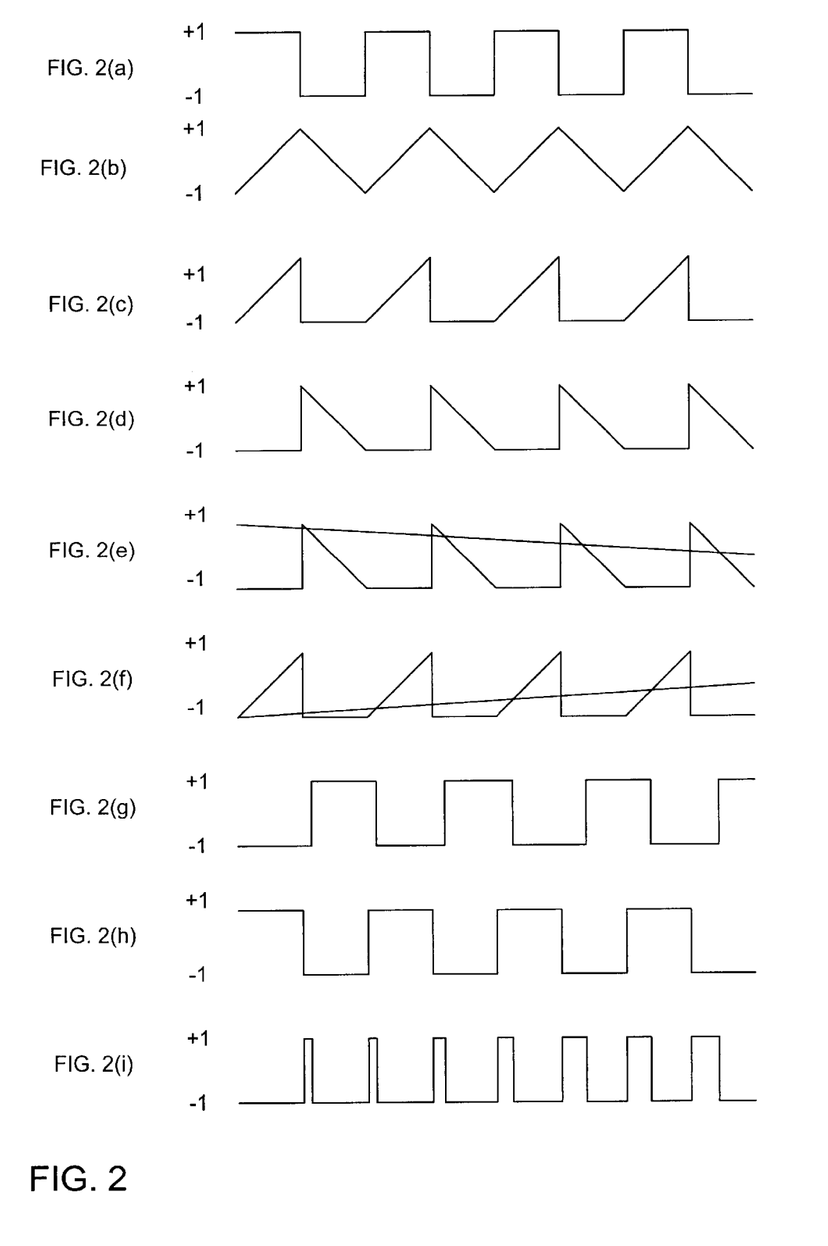
FIG. 2(a–c) includes graphical illustrations of waveforms useful for illustrating steps of an additional exemplary method of the invention.

FIG. 2 illustrates an alternative to FIG. 1. A clock signal is shown in FIGS. 2(*a*) and (*h*). The base carrier waveform of FIG. 2(*b*) is consistent with that of FIG. 1(*b*), as are the segmented falling and rising carrier waveforms of FIGS. 2(*c*) and 2(*d*). The order of comparison is changed with respect to FIG. 1, however, with the falling portion waveform of FIG. 2(*d*) compared to the modulating function as graphically represented in FIG. 2(*e*), and the rising portion waveform of FIG. 2(*c*) compared to the negative of the modulating function as graphically shown in FIG. 2(*f*). This change of comparison order results in the output PWM signal of FIG. 2(*i*) to have phase lagging behavior, as opposed to the phase leading behavior shown in FIG. 1(*i*). The combination of phase-lagging and phase-leading behavior possible through methods steps of the invention gives rise to a "cycloconverter" approach in which natural commutation switch action is possible.

Figure 3:
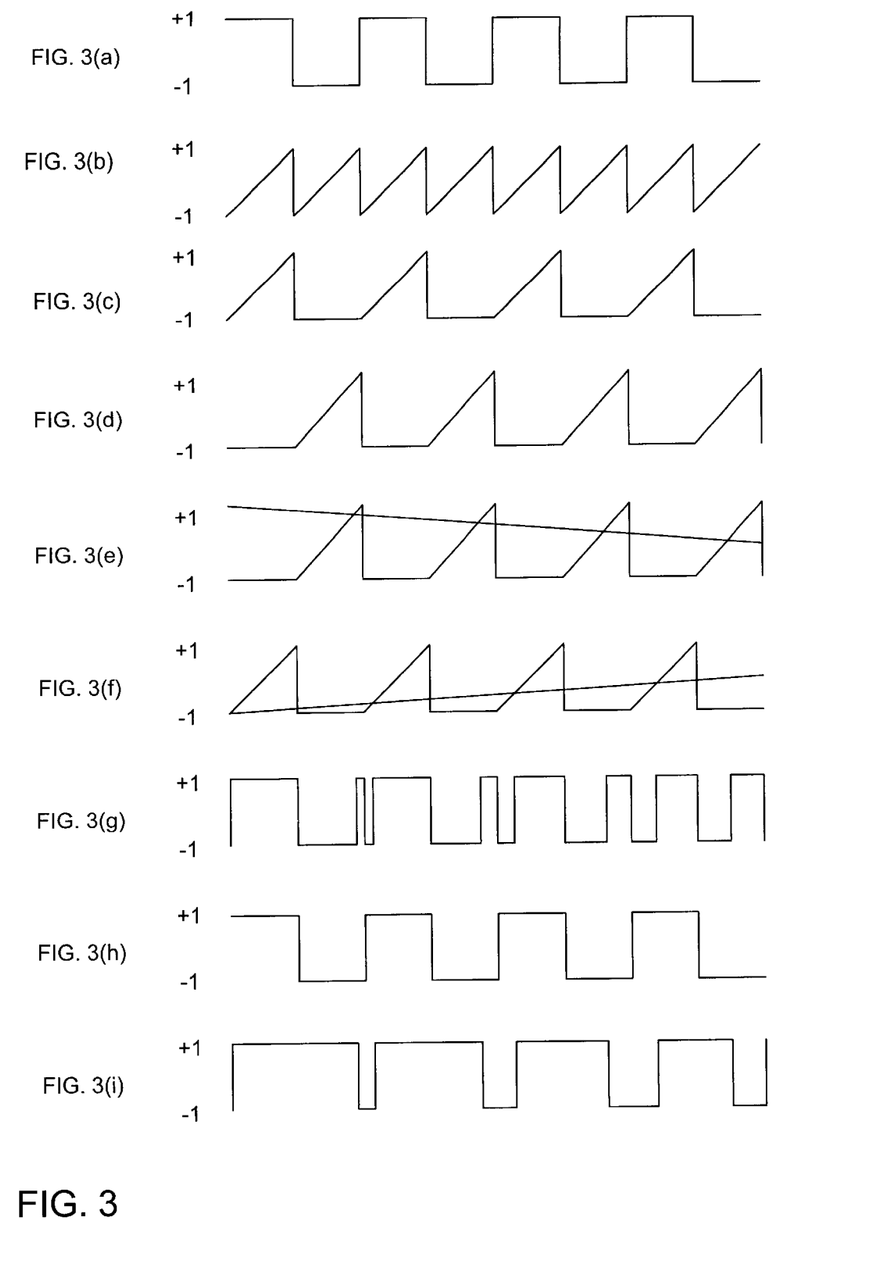
FIG. 3(*a–c*) includes graphical illustrations of waveforms useful for illustrating steps of still an additional exemplary method of the invention.

FIG. 3 is useful for illustrating an additional exemplary method of the invention. FIG. 3 is generally consistent with FIGS. 1 and 2, except that an always rising base carrier waveform shown in FIG. 3(*b*) is segmented on a time basis into the two carrier waveforms graphically illustrated in FIGS. 3(*c*) and 3(*d*). These segmented carrier waveforms are compared to the modulated signal and negative modulated signal, as is graphically illustrated by FIGS. 3(*e*) and 3(*f*), respectively. The outputs of these comparisons are added to one another to result in the PWM control signal waveform illustrated in FIG. 3(*g*). Convolving this signal with the clock signal of FIG. 3(*h*) results in the output PWM waveform shown in FIG. 3(*i*). It is noted with respect to FIG. 3 that FIGS. 1 and 2 illustrate more preferred invention embodiments for natural commutation applications.

Although FIGS 1–3 graphically illustrate methods of the invention that segment a base carrier waveform into two carrier waveforms, other invention embodiments may include a step of segmenting a base carrier waveform into more than two carrier waveforms. By way of example, four or six carrier waves may be formed. For a practical matter, almost any multiple of two carrier waveforms may be formed. Additionally, FIGS. 1–3 illustrate method embodiments in which two modulating signals are provided. Other invention embodiments may include steps of using other numbers of modulating signals. It is contemplated that an invention embodiment may be of use that uses only a single modulating signal. More preferably, at least two modulating signals are provided, and four if the number of carrier waveforms is six or more.

Also, as will be understood by those skilled in the art, the frequency of the carrier waveform is normally much higher than that in the modulating signal. Higher carrier frequencies allow for easier filtering of PWM waveforms. A high carrier frequency is more suitable for transformer coupling that the modulating signal itself, since higher frequencies can be delivered with smaller magnetic devices.

Figure 4:
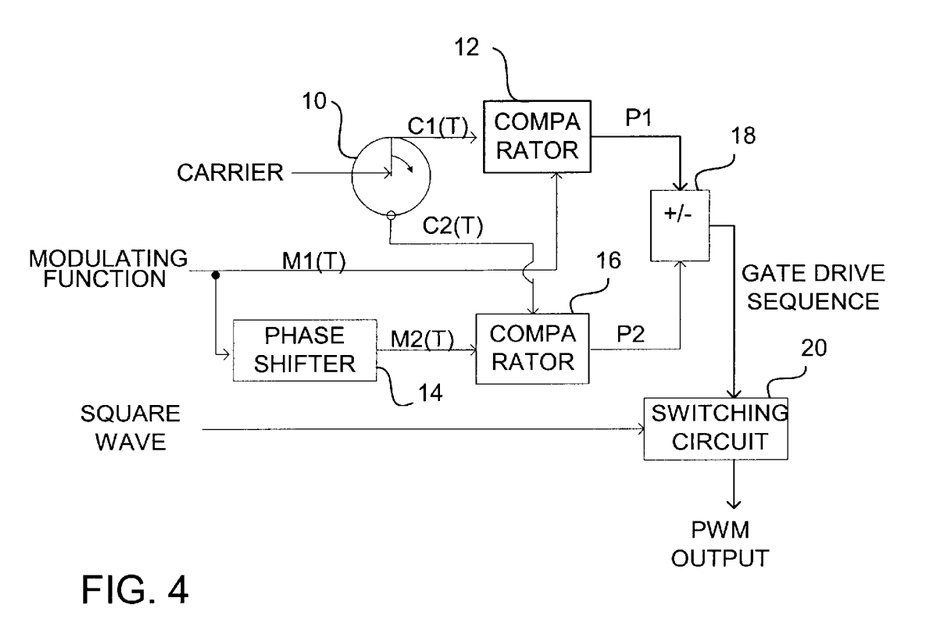
FIG. 4 is a schematic diagram of an exemplary system of the invention.

FIG. 4 is a schematic block diagram useful for illustrating an exemplary system and method of the invention for generating a gate control sequence PWM signal that may be generally similar to that illustrated by FIGS. 1(*g*), 2(*g*), and 3(*g*); and for producing PWM output that may be generally similar with the output PWM signals shown in FIG. 1(*i*), 2(*i*), and/or 3(*i*). A base carrier waveform such as a triangle or a sawtooth ramp is input to a segmenter 10 that segments the base carrier waveform on a time basis into two individual carrier waveforms, C1(T) and C2(T). The segmenter 10 may comprise a decommutator, phase shifter, or the like. By way of particular example, suitable decommutators can be found in time-division multiplexing (TDM) communication systems. The segmenter 10 is operating in synchronism with the carrier clock. The segmentation or decommutation rate f is set to the same as the frequency as the carrier in case of a ramp waveform, or to twice the frequency in the case of a triangle waveform.

A modulating function M1(T) is communicated to first comparator 12 for comparing to the carrier waveform C1(T). The modulating function M1(T) is processed by a 180° phase-shifter 14, and the phase shifted output modulating function M2(T) is communicated to a second comparator 16 for comparison to the carrier waveform C2(T). Each of the comparators 12 and 16 outputs a conventional PWM sequence (P1 and P2, respectively). The comparator outputs P1 and P2 are combined mathematically ("combined mathematically" and like terms as used herein is intended to broadly refer to combination through mathematic operation such as addition, subtraction, or the like) at mathematical operator 18 to generate a gate drive sequence, which as those skilled in the art will appreciate consists of a pulse width modulated signal.

The mathematical operator may comprise any of a variety of adders, subtractors, arithmetic logic units, or like elements that are generally known in the art. The gate control sequence is for controlling a switching circuit 20 that may be any of a variety of elements, with examples including but not limited to a transistor, a circuit or circuits, a logical switch or gate, an inverter circuit, a relay, a semi-conducting device, and the like. A preferred switching circuit 20 comprises a switching power converter. The switching circuit 20 also receives an input square wave such as a clock signal. With the right choices of phasing, gate sequences will result that operate to switch or control the switching circuit 20 against a square-wave source such as the high frequency link voltage input to produce PWM output. The sequences can be two-level or three-level.

The input square wave may be of high frequency to form a high frequency ("HF") link. To generate HF links, the gate control sequence should avoid low-frequency content, yet should also retain information about the modulating function. One way to accomplish this is to generate two sequences (e.g., P1 and P2), then subtract them to eliminate low-frequency modulation. The result is a three-level signal. An alternative is to modulate one sequence with a function m(t), the other with -m(t), and then add them. The result is a two-level signal. Since the sequences are constrained to separate time windows, the combination still retains information about the underlying m(t) function, even though low-frequency content is removed.

In considering the block diagram of FIG. 4, it will be appreciated that the gate drive sequence and the square wave are generally interchangeable with regards to the switching circuit 20. That is, either of the gate drive sequence or the square wave may be used to control the switching circuit 20, and either may be used as the power input. Different applications may make use of one or the other of the signals preferred for control of the switching circuit 20.

Through practice of the exemplary schematic of FIG. 4, families of multi-carrier PWM sequences can be constructed. Table 1 lists nine two-carrier conditions, the resulting sequences, and the ultimate equivalent PWM approach that would have generated the same output. The four shaded entries in Table 1 (rows 2, 5, 6 and 9) are graphically depicted in FIG. 5 as examples. Also in FIG. 5, the control sequence is "mixed" with a square wave to show the recovery of a two-level PWM signal at the converter output. All the sequences given in Table 1 are intended for HF link applications: the modulation and combination processes are selected to cancel out the carrier, either with a phase shift or by subtraction.

TABLE 1

The combination conditions and resulting two-carrier PWM sequences

| | Carrier Type | Phase Shifter 1 | Phase Shifter 2 | Phase Shifter 3 | Combining Method | Gate Drive Signal Type | Output PWM Equivalent |
|---|---|---|---|---|---|---|---|
| 1 | Triangle | 0 | 0 | 180° | Add | 2-Level | Ramp PWM at double $f_{switch}$ |
| 2 | Triangle | 0 | 180° | 0 | Add | 2-Level | Ramp PWM at double $f_{switch}$ |
| 3 | Triangle | 0 | 0 | 0 | Subtract | 3-Level | Triangle PWM |
| 4 | Triangle | 180° | 0 | 180° | Add | 2-Level | Ramp PWM at double $f_{switch}$ |
| 5 | Triangle | 180° | 180° | 0 | Add | 2-Level | Ramp PWM at double $f_{switch}$ |
| 6 | Triangle | 180° | 0 | 0 | Subtract | 3-Level | Triangle PWM |
| 7 | Ramp | 0 | 0 | 180° | Add | 2-Level | Triangle PWM |
| 8 | Ramp | 0 | 180° | 0 | Add | 2-Level | Triangle PWM |
| 9 | Ramp | 0 | 0 | 0 | Subtract | 3-Level | Ramp PWM at double $f_{switch}$ |

Figure 5:
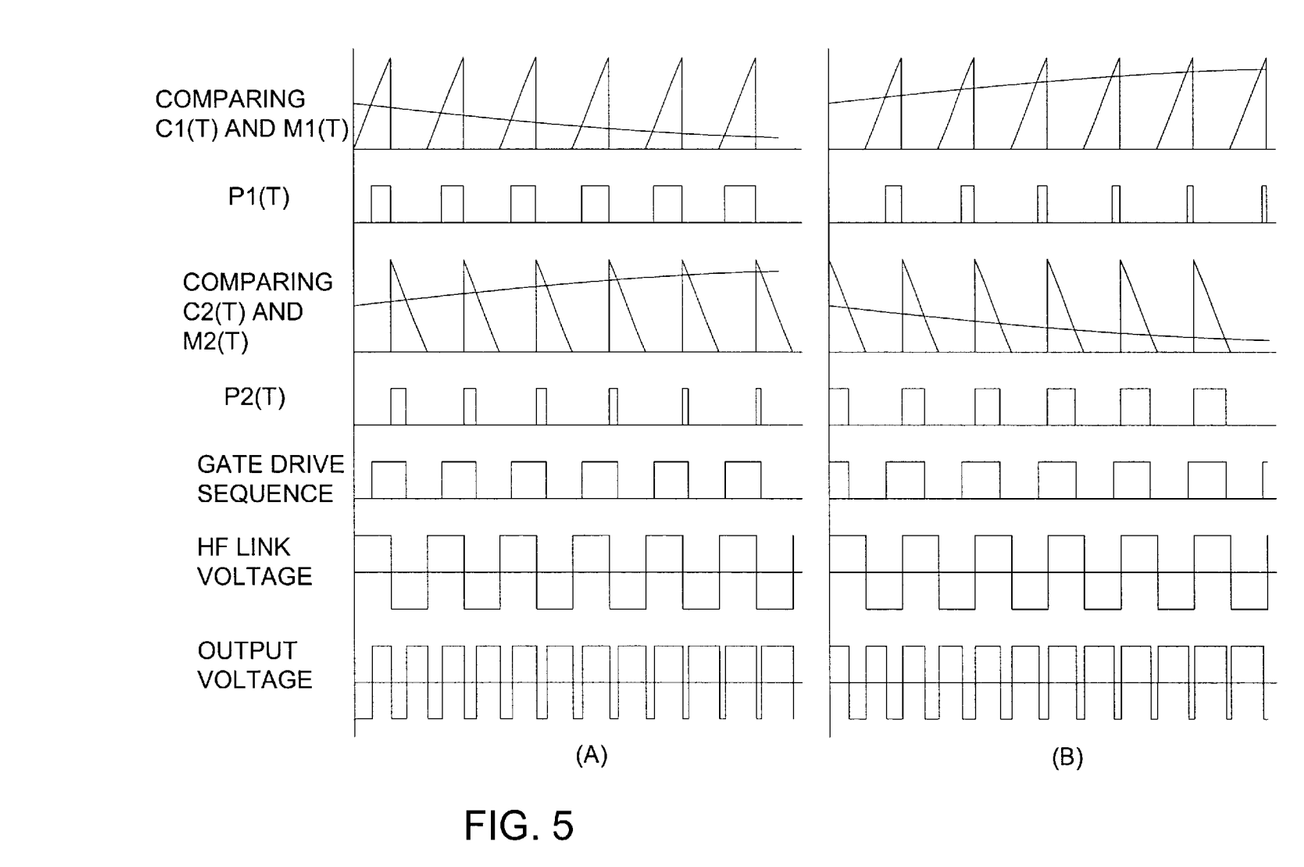
FIG. 5 includes graphical illustrations of selected data from Table 1.

The gate sequence waveforms in FIG. 5 demonstrate several advantageous aspects of exemplary multiple-carrier PWM methods and systems of the invention. The two-level gate sequences in FIGS. 5(a) and 5(b), for instance, maintain a duty ratio of nearly 50% all the way through the cycle. The 50% duty ratio supports convenient transformer isolation for the gate drives. Since the pulse width has virtually no dynamic range, there are no limitations for narrow or wide pulses. The gate drive sequence in FIG. 5(a) is always phase-lagged relative to the HF link square-wave, while that in FIG. 5(b) always leads. Thus, unidirectional devices can be used in the output stage. If sequence (a) is used when load current is positive while (b) is used for negative load current, a complete naturally-commutated PWM cycloconverter results.

The sequences in FIGS. 5(a), 5(b) and 5(c) all produce ultimate PWM outputs with an effective switching frequency double that of the switching devices—with advantages for switching losses. Those in FIGS. 5(c) and 5(d) provide HF link gate drives, with simple rectification at the gate terminals to recover the correct signals. Those skilled in the art will appreciate that there are many alternatives within the scope of the invention for generating multiple-carrier PWM signals, such as the use of synchronized push-pull PWM ICs, or digital approaches.

Figure 6:
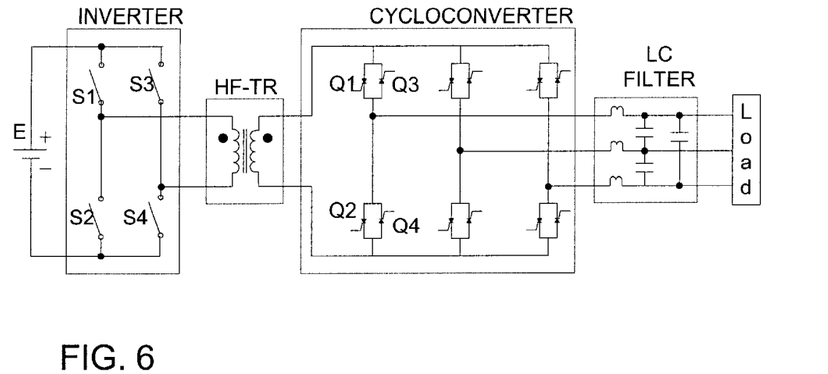
FIG. 6 shows an exemplary three-phase cycloconverter-type HF link inverter.

FIG. 6 shows an exemplary three-phase cycloconverter-type HF link inverter, which consists of an open-loop inverter to generate a 50% square wave, a HF transformer, the output converter, and passive filtering for the output. It is intended to use two-carrier PWM for natural commutation. The primary-side inverter bridge uses unipolar devices (MOSFETs or IGBTs with inverse diodes), while the three-phase output bridge consists of twelve unidirectional switches organized in six pairs. With natural commutation, only the leading edge of the gate pulses is needed, and the only feedback is the sign of the output current.

Figure 7:
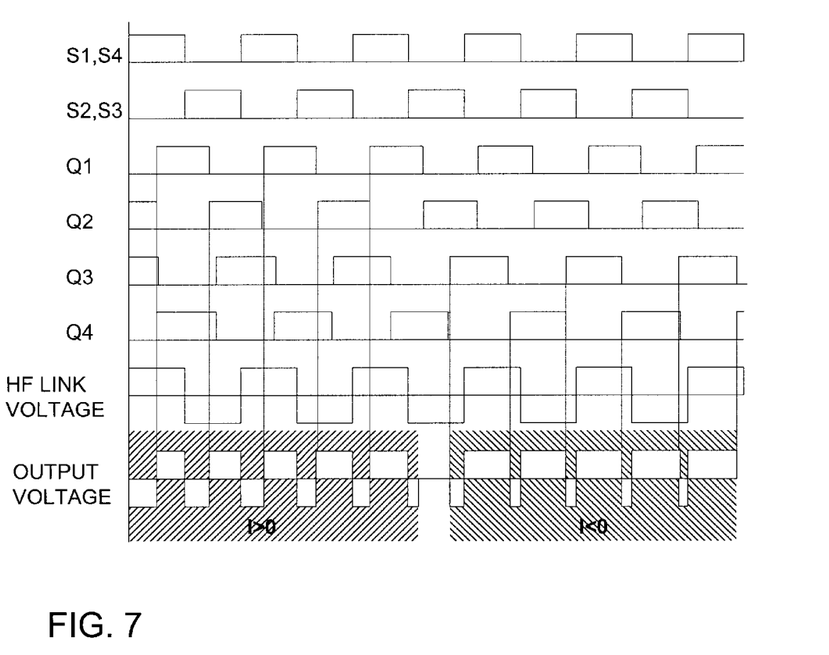
FIG. 7 shows a switch timing diagram for a single-phase cycloconverter-type HF link inverter.

The single-phase version of FIG. 6 is advantageous because control can be applied either at the input bridge or the output bridge. The gate sequence, multiplied by the square wave, recovers a conventional PWM output. FIG. 7 shows a switch timing diagram for a single-phase cycloconverter-type HF link inverter. Natural commutation in the HF link circuit is not affected significantly by dead time. When a short dead time is provided for the primary-side inverter, the output cannot be quite as high, but the general operation is unaffected.

Figure 8:
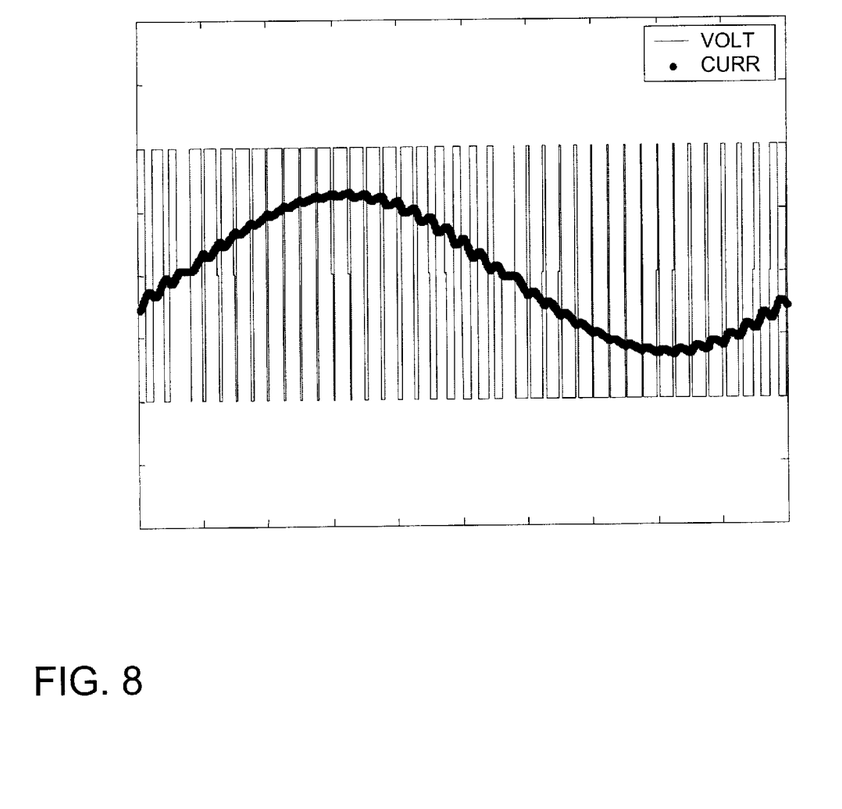
FIG. 8 shows a simulation result for the HF link inverter of FIG. 6.

FIG. 8 shows a simulation result for this HF link inverter, running under two-carrier PWM to provide natural commutation. The load frequency is 50 Hz, the switching frequency is 1 kHz, and a passive filter designed for this output has been applied to allow easy identification of the current waveform. The dead-time for the primary-side inverter has been expanded to 60 millisec to make it clearly visible. It is noted that the waveforms and ripple behavior are the same as those of conventional PWM.

Figure 9:
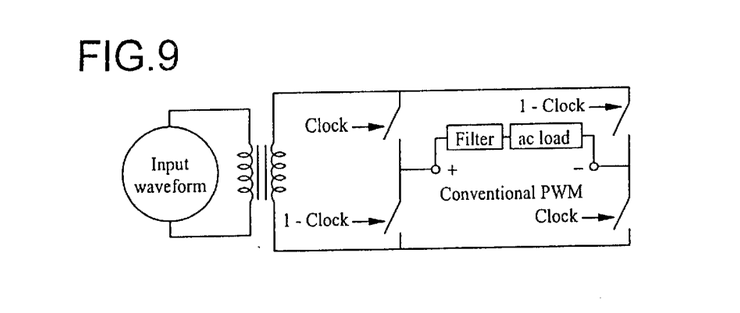
FIG. 9 is a circuit diagram of an exemplary inverter.

The circuit diagram of FIG. 9 illustrates a system of the invention that embodies a direct way to utilize the waveforms of FIG. 1 to produce an inverter. In this case, the waveform PWM1 of FIG. 1(g) is used to create a square-wave voltage source of positive and negative polarity. The only difference between the input waveform and the signal shown in FIG. 1(g) is that the magnitude used in FIG. 4 can be any voltage, not just 1 V. The four switches labeled "clock" in the bridge are operated at a fixed 50% duty-directly from the clock signal. At the output terminals, the result is conventional PWM as in FIG. 1(i).

Figure 10:
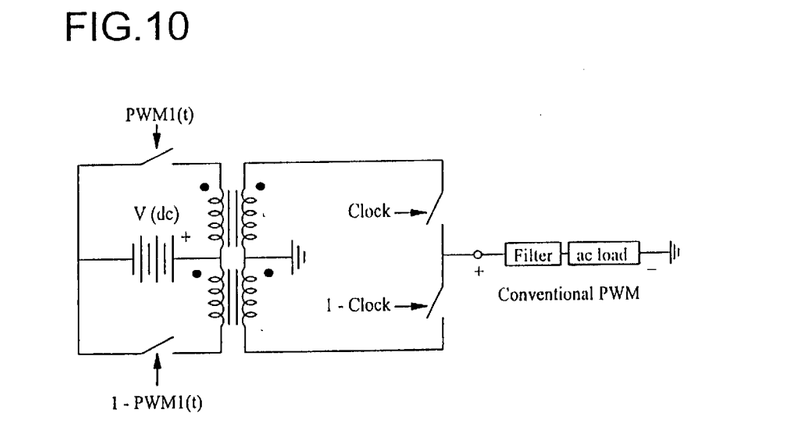
FIG. 10 is a circuit diagram of an additional exemplary inverter.

The circuit diagram of FIG. 10 illustrates an additional exemplary system of the invention for creation of the source waveform of FIG. 1 from a fixed DC potential to produce a complete inverter. In this case, waveform PWM1(t) (e.g., FIG. 1(g)) and 1—PWM1(t) control two switches in a push-pull manner. The output switches operate at fixed 50% duty from the clock (or 1—clock) to recover the desired PWM. This is then filtered in a usual way for delivery to a load. In FIG. 10, as in FIG. 9, the waveform process can be reversed: the clock can be used for the input switches, while the PWM1(t) signal can be used for the output switches, with no fundamental change in operation.

Figure 11:
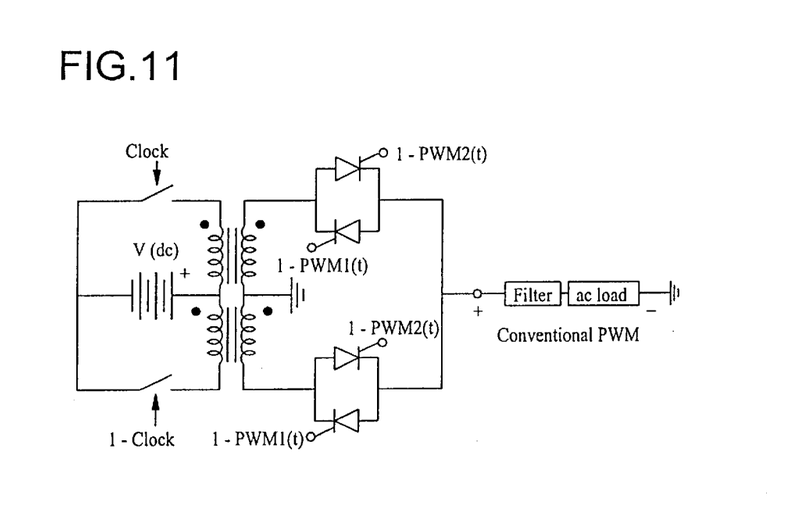
FIG. 11 is a circuit diagram of an exemplary naturally-commutated circuit of the invention.

FIG. 11 shows an exemplary naturally-commutated circuit of the invention for inverter applications. Here, the input switches operate based on the clock signal. The output devices use a combination of PWM1(t) (e.g., FIG. 1(g)) and PWM2(t) (e.g., FIG. 2(g)). The combination is selected in a conventional way: when the output load current is positive, the choice is made to use a waveform with only phase delay (turn-off delay) relative to the clock. When the output is positive, the choice is made to use only phase advance. With this strategy, single-sided devices such as silicon-controlled rectifiers (SCRs) can be used for output.

In an additional exemplary embodiment of the invention, a base carrier waveform is segmented into four carrier waveforms. These four carrier waveforms are then compared to two modulating signals to encode both signals into a single PWM gate drive sequence. The sequence is then used in conjunction with a synchronized square wave, and then with a second square wave in quadrature (¼ cycle shift) with the first. Modulation with "Left" and "Right" signals (such as might be found in an audio application, for example) is performed as follows:

| Carrier 1: | Left − Right |
| Carrier 2: | Left + Right |
| Carrier 3: | − Left + Right |
| Carrier 4: | − Left − Right |

When the four PWM streams from these modulators are combined, the result is a single PWM stream with no low frequency content. The single stream can be delivered to switch gates through transformers, or can be delivered through a power transformer. When the PWM stream is convolved with a square wave, high when carriers 1 and 2 are active and low when 3 and 4 are active, the output is the Left signal. A quadrature square wave yields the Right signal. Other combinations are possible that yield 50% duty ratio PWM streams with edge coding of the power information. Applications include class-D switching amplifiers for stereo audio and the like. In an application such as a three-phase motor drive, it is convenient to use three modulating functions A, B, and C, use six carrier waveforms, and combine the results in to a single PWM stream. In this way one PWM signal, associated with three fixed clock signals, can deliver three outputs associated with A, B, and C in a single stage.

Some of the practical advantages of multiple-carrier PWM of the invention in the context of a naturally-commutated HF link inverter include the ease of implementation and the simplicity of gate drive circuits. Additional more formal advantages are related to the PWM process of the invention: the output voltage waveforms can be arranged to match conventional two-level PWM signals, and prior understandings of harmonics, filter design, ripple, and other design issues can be applied directly. Multi-carrier PWM methods and systems of the invention serve as a direct way to construct HF inverter control waveforms. Resultant PWM output provides gating signals suitable for square-wave cycloconverters, for isolated gate drives, and for other implementation aspects of HF link inverters. The output results match those of conventional two-level PWM, except that the effective switching frequency doubles. Multi-carrier PWM techniques and systems of the present invention are believed to have particular promise in the implementation of low-cost inverters, as well as for HF link applications of medium power (1 kW–20 kW).

Additionally, waveforms produced through practice of the present invention are true PWM output waveforms, rather than the phase-shifted results produced in a cycloconverter. This means that the PWM signals can be designed based on any desired requirements, and can be set up to have specific frequency content or to produce a specific waveform shape. The control is easy to generate and couple directly into the switching devices. Methods and systems of the invention, for example, can be valuable for use with audio amplifier applications with variable signals.

It is intended that the specific embodiments and configurations herein disclosed are illustrative of the preferred and best modes for practicing the invention, and should not be interpreted as limitations on the scope of the invention as defined by the appended claims.

What is claimed is:

1. A method for generating a pulse width modulated control signal comprising the steps of:
   providing a base carrier waveform;
   segmenting said base carrier waveform into a plurality of individual carrier waveforms;
   providing at least one modulating signal;
   comparing said plurality of carrier waveforms to said at least one modulating signal to produce a plurality of comparator outputs; and,
   mathematically combining said plurality of comparator outputs to produce a pulse width modulated control signal.

2. A method for generating a pulse width modulated control signal as defined by claim 1 wherein the method is further for providing a pulse width modulated output, and further comprises the steps of:
   inputting a square wave signal to a switching circuit; and
   inputting said pulse width modulated control signal to said switching circuit, said switching circuit using said pulse width modulated control signal and said square wave signal to generate the pulse width modulated output.

3. A method for generating a pulse width modulated output as defined by claim 2 wherein said pulse width modulated control signal is used to control said switching circuit.

4. A method for generating a pulse width modulated output as defined by claim 2 wherein said square wave signal is used to control said switching circuit.

5. A method for generating a pulse width modulated output as defined by claim 2 wherein said switching circuit comprises an inverter circuit.

6. A system for generating a pulse width modulated output as defined by claim 2 wherein said switching circuit comprises a switching power converter.

7. A system for generating a pulse width modulated output as defined by claim 2 wherein said square wave signal comprises a clock signal.

8. A method for generating a pulse width modulated control signal as defined by claim 1 wherein the method is further for providing a pulse width modulated output signal, and further comprises the steps of:
   convolving said pulse width control signal with a clock signal to generate the pulse width modulated output.

9. A method for generating a pulse width modulated control signal as defined by claim 1 wherein the step of mathematically combining said plurality of comparator outputs comprises adding said plurality of comparator outputs together.

10. A method for generating a pulse width modulated control signal as defined by claim 1 wherein the step of mathematically combining said plurality of comparator outputs comprises subtracting one of said plurality of comparator outputs from another of said plurality of comparator outputs.

11. A method for generating a pulse width modulated control signal as defined by claim 1 wherein said base carrier waveform has rising and falling portions, and wherein the step of segmenting said base carrier waveform comprises using said rising portions to define a first carrier waveform and using said falling portions to define a second carrier waveform.

12. A method for generating a pulse width modulated control signal as defined by claim 1 wherein the step of segmenting said base carrier waveform comprises segmenting said base carrier waveform on a time basis.

13. A method for generating a pulse width modulated control signal as defined by claim 1 wherein the step of segmenting said base carrier waveform comprises either phase shifting said base carrier waveform or segmenting said base carrier waveform on a voltage level basis.

14. A method for generating a pulse width modulated control signal as defined by claim 1 wherein said at least one modulating signal comprises a plurality of modulating signals, and wherein the step of comparing said plurality of carrier waveforms to said at least one modulating signal comprises comparing a first of said plurality of carrier waveforms to a first modulating signal to provide a first comparator output, and comparing a second of said plurality of carrier waveforms to a second modulating signal to provide a second comparator output.

15. A method for generating a pulse width modulated control signal as defined by claim 14 wherein said first modulated signal is phase shifted by 180° to define said second modulated signal.

16. A method for generating a pulse width modulated control signal as defined by claim 1 wherein said pulse width modulated control signal is a three level signal.

17. A method for generating a pulse width modulated control signal as defined by claim 1 wherein said plurality of carrier waves comprises at least four carrier waves.

18. A method for generating a pulse width modulated output from a plurality of carrier waveforms comprising the steps of:
   providing a base carrier waveform;
   segmenting said base carrier waveform on a time basis into at least a first carrier waveform and a second carrier waveform;
   providing a first modulating signal and comparing said first carrier waveform to said modulating signal to provide first comparator output;
   phase-shifting said first modulating signal to define a second modulating signal;
   comparing said second carrier waveform to said second carrier waveform to provide second comparator output;
   mathematically combining said first comparator output with said second comparator output to produce a gate drive sequence; and,
   inputting a square wave power signal to a power conversion switching circuit; and,
   controlling said power conversion switching circuit with said gate drive sequence whereby said power conversion switching circuit outputs the pulse width modulated output.

19. A system for generating a gate drive sequence comprising:
   a segmenter operative to segment a base carrier waveform into a plurality of carrier waveforms;
   a plurality of comparators linked to said segmenter and linked to at least one modulating signal, said plurality of comparators operative to compare said plurality of carrier waveforms to said at least one modulating signal; and, a mathematical operator linked to said plurality of comparators and operative to mathematically combine output from said first and second comparators and to output the gate drive sequence.

20. A system for generating pulse width modulated output including the system defined by claim 19, and further including:

a switching circuit linked to said mathematical operator and linked to an input square wave signal, said switching circuit operative to use said square wave signal and said gate drive sequence to provide the pulse width modulated output.

21. A system for generating pulse width modulated output as defined by claim 20 wherein said switching circuit comprises a switching power converter, and wherein said square wave signal comprises a power signal.

22. A system for generating pulse width modulated output as defined by claim 20 wherein said switching circuit is controlled by said gate drive sequence.

23. A system for generating a gate drive sequence as defined by claim 19 wherein said mathematical operator is operative to either add output from each of said plurality of comparators, or to subtract output from said plurality of comparators.

24. A system for generating a gate drive sequence as defined by claim 19 wherein said at least one modulated signal comprises at least a first and a second modulated signal, and wherein the system further comprises a phase shifter for shifting the phase of said first modulated signal to define said second modulated signal, said phase shifter linked to at least one of said plurality of comparators.

25. A system for generating a gate drive sequence as defined by claim 24 wherein said phase shifter shifts said first modulated signal by about 180° to define said second modulated signal.

26. A system for generating a gate drive sequence as defined by claim 19 wherein said segmenter comprises a time segmenter.

27. A system for generating a gate drive sequence as defined by claim 19 wherein said base carrier waveform has rising and falling portions, and wherein said segmenter is operative to segment said base carrier waveform into at least first and second carrier waveforms, said first carrier waveform comprising rising portions and said second carrier waveform comprising falling portions.

28. A system for generating a gate drive sequence as defined by claim 19 wherein said segmenter is operative to segment said base carrier waveform into at least four carrier waveforms, and wherein said plurality of comparators comprises at least four comparators.

* * * * *

UNITED STATES PATENT AND TRADEMARK OFFICE
CERTIFICATE OF CORRECTION

PATENT NO. : 6,700,803 B2
DATED : March 2, 2004
INVENTOR(S) : Krein

It is certified that error appears in the above-identified patent and that said Letters Patent is hereby corrected as shown below:

Title page,
Item [56], References Cited, U.S. PATENT DOCUMENTS, insert:
-- 5,977,741　　11/99　　　　DeLange et al.
　 5,650,708　　7/97　　　　 Sawada et al. --
OTHER PUBLICATIONS, insert:
-- "High-Frequency Link Power Conversion," Espelage et al., IEEE Transactions on Industry Applications, Vol. IA-13, No. 5, pp. 387-394 (September/October 1977).
　"A New Multilevel PWM Method: A Theoretical Analysis," Carrara et al., IEEE Transactions on Power Electronics, Vol. 7, No. 3, pp. 497-505 (July 1992).
　"High-Frequency Link DC/AC Converter with Suppressed Voltage Clamp Circuits -- Naturally Commutated Phase Angle Control with Self Turn-Off Devices," Matsui et al., IEEE Transactions on Industry Applications, Vol. 32, No. 2, pp. 293-300, (March/April 1996).
　"Basic Characteristics of Cycloconverter for Linking Commercial and High-Frequency Distribution Lines," Fukao et al., IEEE Transactions on Industry Applications, Vol. IA-23, No. 5, pp. 927-936, (September/October 1987).
　"High Frequency Link DC/AC Converter with PWM Cycloconverter," Kawabata et al., IEEE IAS Annual Meeting, 1990, pp. 1120-1124.
　"High Frequency Link DC/AC Converter with Suppressed Voltage Clamp Circuits -- Naturally Commutated Phase Angle Control with Self Turn-Off Devives," Matsui et al., IEEE Transactions on Industry Applications Vol. 32, No. 2, pp. 293-300 (March/April 1996).
　"Principles of Power Electronics," John G. Kassakian et al., Copyright 1991, pp. 186-188." --

Column 2,
Line 45, change "Signal" to -- signal --.
Line 62, after "FIG. 1" delete "(a-c)".
Line 65, after "FIG. 2" delete "(a-c)".

Column 3,
Line 1, after "FIG. 3" delete "(a-c)".

Column 5,
Line 7, change "f" to -- $f$ --.

UNITED STATES PATENT AND TRADEMARK OFFICE
CERTIFICATE OF CORRECTION

PATENT NO. : 6,700,803 B2
DATED : March 2, 2004
INVENTOR(S) : Krein

It is certified that error appears in the above-identified patent and that said Letters Patent is hereby corrected as shown below:

Column 6,
Line 4, both occurrences change "m(t)" to -- *m(t)* --.
Line 7, change "m(t)" to -- *m(t)* --.
Line 32, Table 1, rows numbered 2, 5, 6 and 9 should be shaded.

Column 7,
Line 49, after "duty" insert -- — --;
Line 50, change "-directly" to -- directly --.

Signed and Sealed this

Twenty-eighth Day of September, 2004

JON W. DUDAS
*Director of the United States Patent and Trademark Office*